United States Patent
Antosh et al.

(10) Patent No.: US 6,901,541 B2
(45) Date of Patent: May 31, 2005

(54) MEMORY TESTING METHOD AND APPARATUS

(75) Inventors: Jeff Antosh, Nampa, ID (US); Rex Jackson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 487 days.

(21) Appl. No.: 09/804,837

(22) Filed: Mar. 13, 2001

(65) Prior Publication Data

US 2002/0133765 A1 Sep. 19, 2002

(51) Int. Cl.[7] .................................................. G11C 29/00
(52) U.S. Cl. ...................................................... 714/718
(58) Field of Search ................................ 714/718, 724; 365/201, 185, 149; 324/765

(56) References Cited

U.S. PATENT DOCUMENTS

| | | | | |
|---|---|---|---|---|
| 5,561,628 A | * | 10/1996 | Terada et al. | 365/185.04 |
| 5,604,756 A | * | 2/1997 | Kawata | 714/773 |
| 5,787,096 A | | 7/1998 | Roberts et al. | 714/718 |
| 5,936,901 A | | 8/1999 | Wong et al. | 365/201 |
| 5,999,446 A | * | 12/1999 | Harari et al. | 365/185.03 |
| 6,081,467 A | | 6/2000 | Waller | 365/201 |
| 6,219,289 B1 | * | 4/2001 | Satoh et al. | 365/201 |
| 6,349,396 B2 | * | 2/2002 | Akram | 714/724 |

* cited by examiner

*Primary Examiner*—Shelly A Chase
(74) *Attorney, Agent, or Firm*—Schwegman, Lundberg, Woessner & Kluth, P.A.

(57) ABSTRACT

A method of testing memory devices includes issuing a command to a Flash memory device, simultaneously monitoring at least one data bit of each Flash memory device for a ready indication, and then verifying the command was performed successfully in each Flash memory device. The command can be an erase command, a write command, or the like. The simultaneous monitoring can be performed by simultaneously asserting signals on output enable nodes of the memory devices, and monitoring bidirectional tester channels dedicated for this purpose. A test fixture includes memory device receptacles, a tester interface, and conductive paths to couple the tester interface to the memory device receptacles. The conductive paths include paths for dedicated bidirectional tester channels and shared bidirectional tester channels.

45 Claims, 6 Drawing Sheets

MEMORY TESTING METHOD AND APPARATUS

TECHNICAL FIELD OF THE INVENTION

The present invention relates generally to memory devices, and in particular, the present invention relates to the testing of memory devices.

BACKGROUND OF THE INVENTION

Memory devices are typically manufactured many at a time. After manufacture, they are typically packaged and tested. Many current mechanisms for testing memory devices rely on a set of serial operations performed one at a time using expensive memory testers. One such mechanism is illustrated by FIGS. 1A and 1B.

FIG. 1A is a prior art memory test configuration. Memory testing configuration 100 includes tester 110 and memory devices 102, 104, and 106. Memory tester 110 includes bidirectional channels and drive-only channels. Bidirectional tester channels are channels that can source and sink data, and drive-only tester channels are channels that only source data, and do not sink data. Drive-only channels include channels 112, 114, 116, 118, and 122. Each of these drive-only channels drive inputs on memory devices being tested. For example, drive-only channels 112, 114 and 116 drive "output enable" nodes of memory devices 102, 104, and 106, respectively. Drive-only channel 118 drives the "write enable" node on each of the memory devices in parallel. Drive-only channel 122 includes multiple physical channels, and drives the address bus.

Bidirectional tester channel 120 includes "n" physical channels, and is coupled to the data bus of each device to form a shared data bus. This configuration shares the data bus across all memory devices being tested, and allows the bidirectional tester channels to be time shared among multiple memory devices being tested.

FIG. 1B shows an example sequence of operations performed by the memory test configuration of FIG. 1A. The sequence of FIG. 1B include operations 152, 154, 156, 158, 160, and 162. Operation 150 represents the memory command being tested. For example, operation 152 can be a "write" command during which data is written to a location being tested. The data is written to all three memory devices in parallel by virtue of the shared data bus and write enable signal as described above. During operations 154, 156, and 158, the status of memory devices 102, 104, and 106, respectively, is read. The time taken to read the status registers is shown at 164.

Operation 160 repeats operations 154, 156, and 158 until all three memory devices report a status that indicates the command issued in operation 152 is complete. When all three memory devices report the appropriate status, operation 162 verifies that operation 152 was successfully executed. For example, for the case where operation 152 is a write command, operation 162 is a read operation that reads the data from the appropriate location, and compares it with the data written in operation 152.

One drawback of the configuration of FIG. 1A is shown by the serial polling of status shown at 164. The time taken by serial polling increases as more memory devices are added to the test, and the total time increases further for each time the polling sequence is repeated in operation 160.

For the reasons stated above, and for other reasons stated below which will become apparent to those skilled in the art upon reading and understanding the present specification, there is a need in the art for alternate methods and apparatus for testing memory devices.

SUMMARY OF THE INVENTION

The above mentioned problems and other problems are addressed by the present invention and will be understood by reading and studying the following specification.

In one embodiment, a method of testing memory devices includes issuing a command to a Flash memory device, simultaneously monitoring at least one data bit of each Flash memory device for a ready indication, and then verifying the command was performed successfully in each Flash memory device. The command can be an erase command, a write command, or the like. The simultaneous monitoring can be performed by simultaneously asserting signals on output enable nodes of the memory devices, and monitoring bidirectional tester channels dedicated for this purpose.

In another embodiment, a test fixture includes memory device receptacles, a tester interface, and conductive paths to couple the tester interface to the memory device receptacles. The conductive paths include paths for dedicated bidirectional tester channels and shared bidirectional tester channels.

DETAILED DESCRIPTION OF THE INVENTION

Figure 1A:
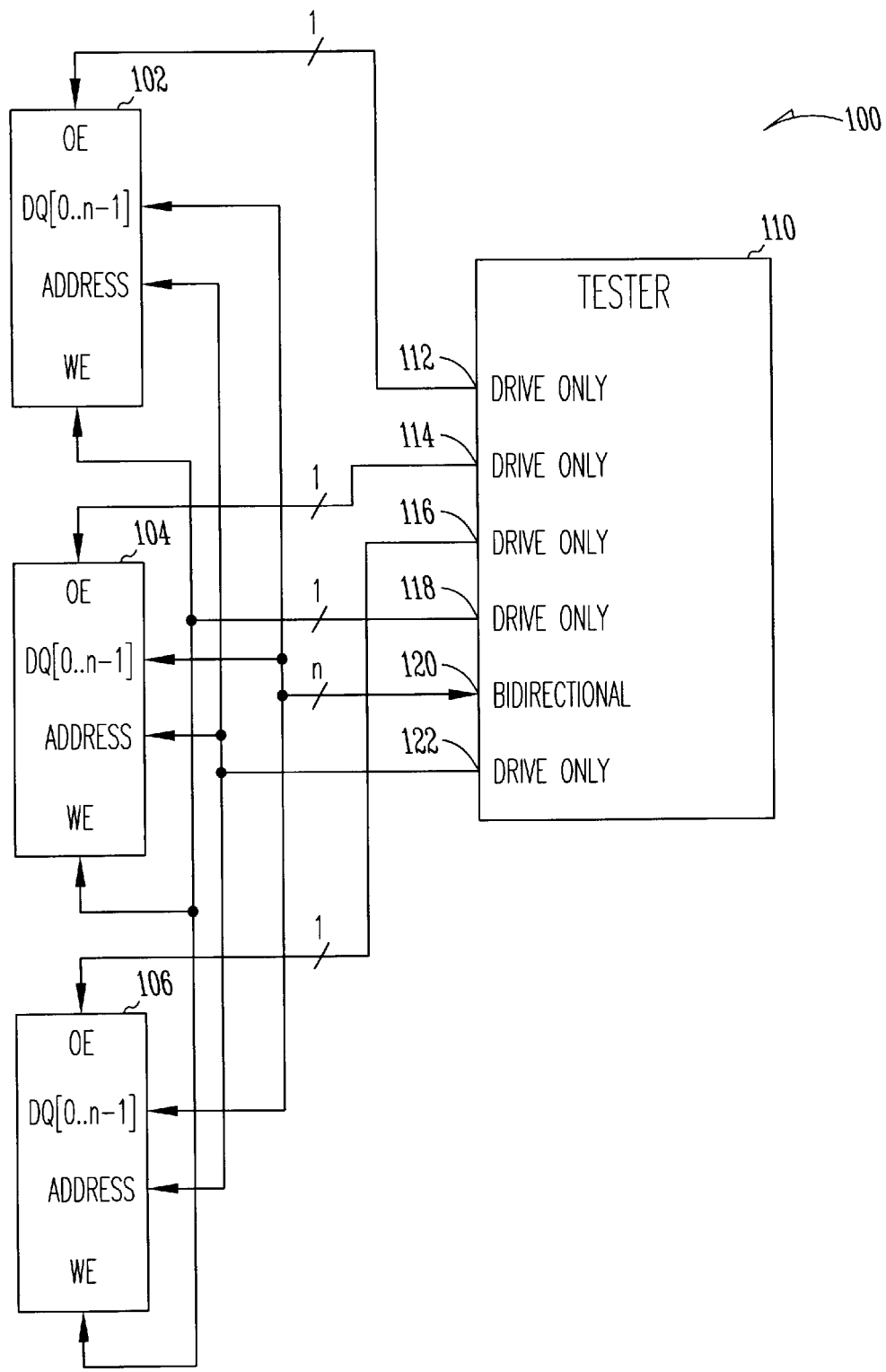
FIG. 1A is a prior art memory test configuration.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 2:
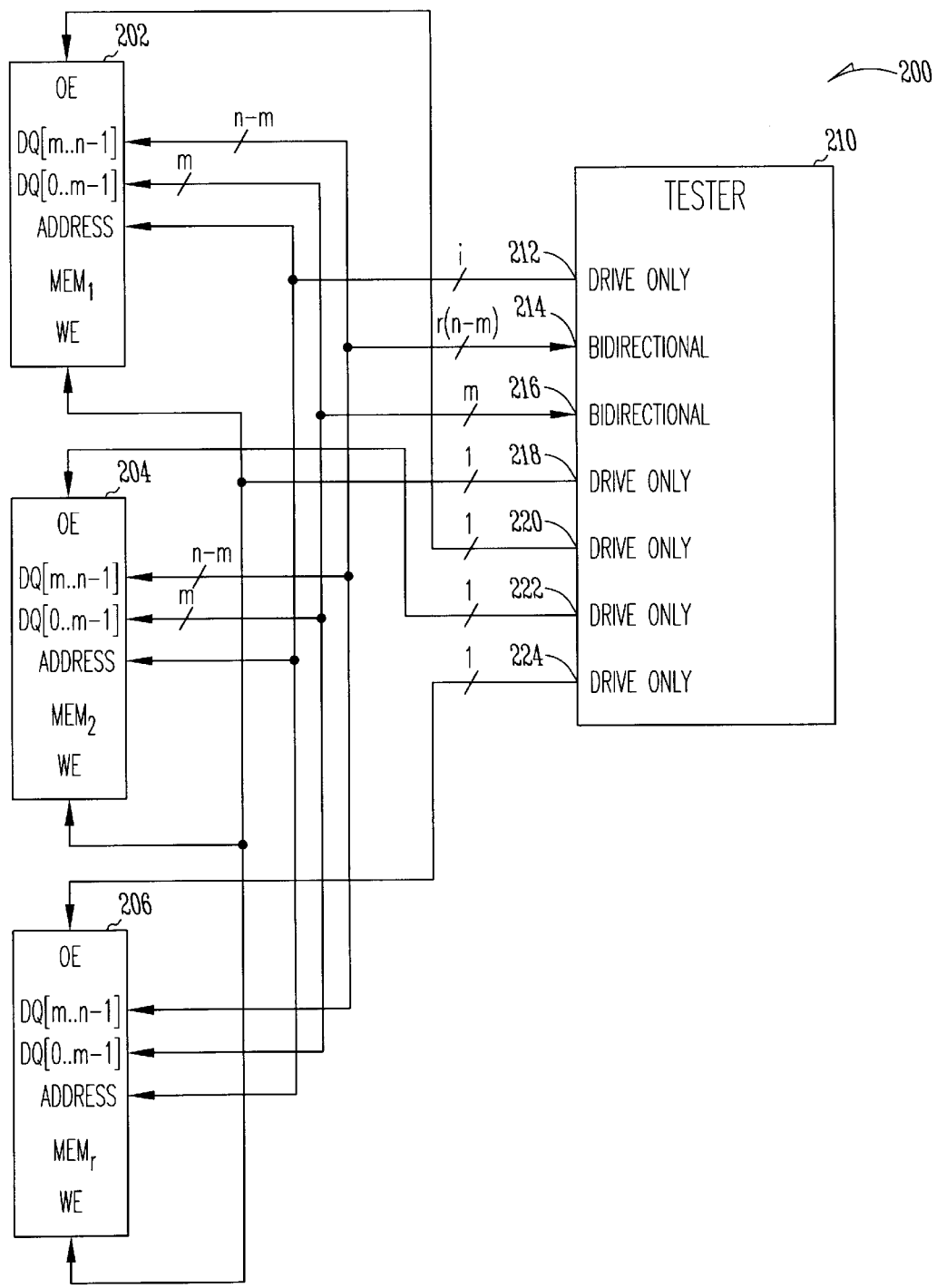
FIG. 2 is one memory testing system of the present invention.

FIG. 2 is one memory testing system of the present invention. FIG. 2 shows memory tester 210 and memory devices 202, 204, and 206. Memory tester 210 can be any type of memory tester, including commercially available models from manufacturers such as Advantest. Memory devices 202, 204, and 206 can be any type of memory device. In some embodiments, memory devices 202, 204, and 206 are "Flash" memory devices that hold their state when power is off.

FIG. 2 shows three memory devices labeled $MEM_1$, $MEM_2$, and $MEM_r$ to signify that "r" memories are present and coupled to memory device tester 210. Each memory includes "i" address bits that are driven in parallel by drive-only channel 212 of memory device tester 210. Output enable pins of each memory device are driven separately by drive-only tester channels. For example, the output enable pin of memory device 202 is driven by drive-only channel 220, the output enable pin of memory device 204 is driven by drive-only channel 222, and the output enable pin of memory device 206 is driven by drive-only channel 224. Write enable pins of each memory device are coupled to shared drive-only channel 218.

Each memory includes "n" data bits that communicate with memory device tester 210 on bidirectional channels 214 and 216. A subset of the "n" data bits are coupled to a shared data bus. This subset includes "m" data bits from each memory device coupled to bidirectional channel 216. Another subset of data bits on each memory device is coupled to memory device tester 210 using dedicated bidirectional channels 214.

The term "dedicated," as used herein, refers to a tester channel dedicated to a single node of a single memory device. As shown in FIG. 2, each of the "r" memory devices has "n-m" data bits coupled to dedicated bidirectional tester channels, for a total of r(n-m) dedicated bidirectional tester channels. By sharing some bidirectional tester channels, and dedicating the others, the total test time can be reduced. This is explained in more detail with reference to FIG. 4. The embodiment of FIG. 2 shows the data bus of width "n" being split into two buses of arbitrary size. The embodiment of FIG. 3, discussed below, shows an eight bit data bus split such that one data bit on each memory device is coupled to a dedicated tester channel, and seven data bits are coupled to shared bidirectional tester channels.

Figure 3:
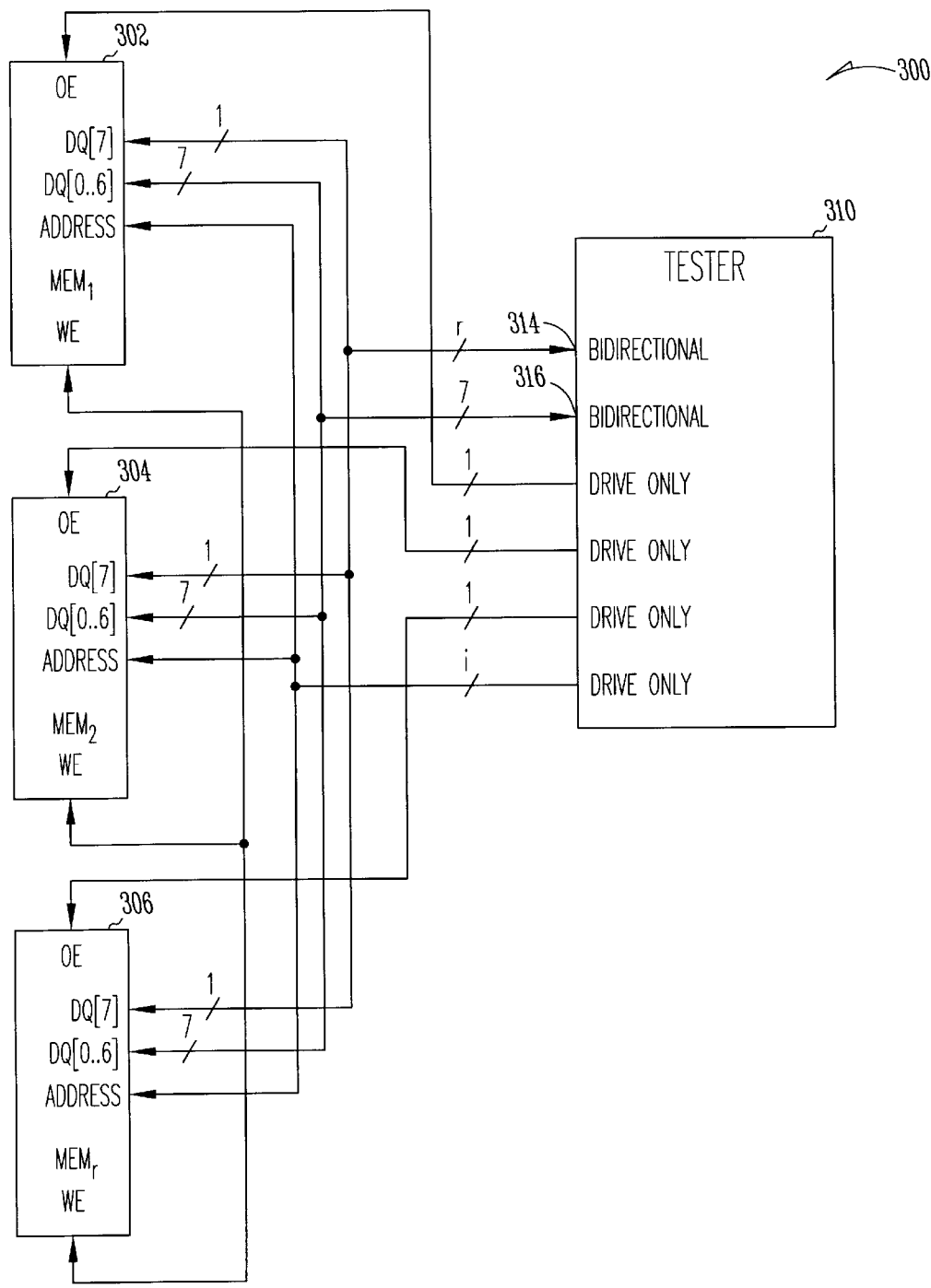
FIG. 3 is another memory testing system of the present invention.

FIG. 3 is another memory testing system of the present invention. Memory testing system 300 includes memory device tester 310 and memory devices 302, 304, and 306. As discussed with reference to FIG. 2, "r" memory devices are present and coupled to memory device tester 310. Each memory device has an eight-bit data bus shown as DQ[0 . . . 7]. Seven bits of the eight-bit data bus are coupled to share bidirectional tester channels 316. The remaining one data bit of each memory device is coupled to a dedicated tester channel, shown in FIG. 3 as 314. As a result, the total number of dedicated tester channels in memory testing system 300 is equal to the number of memory devices being tested.

The output enable nodes of each memory device are driven by a separate drive-only tester channel, allowing them to be asserted simultaneously or separately. The address bits of each memory device are coupled to a shared address bus, such that each memory device receives the same address from memory device tester 310. The write enable nodes of each memory device are also coupled to a shared drive-only tester channel, to allow parallel write operations to occur during testing.

In some embodiments, other nodes exist on the memory devices, and these nodes are driven by shared or dedicated, bidirectional or drive-only, tester channels. For example, in some embodiments, chip enable nodes exist on memory devices, and these nodes are driven in parallel by a shared drive-only tester channel.

Figure 4:
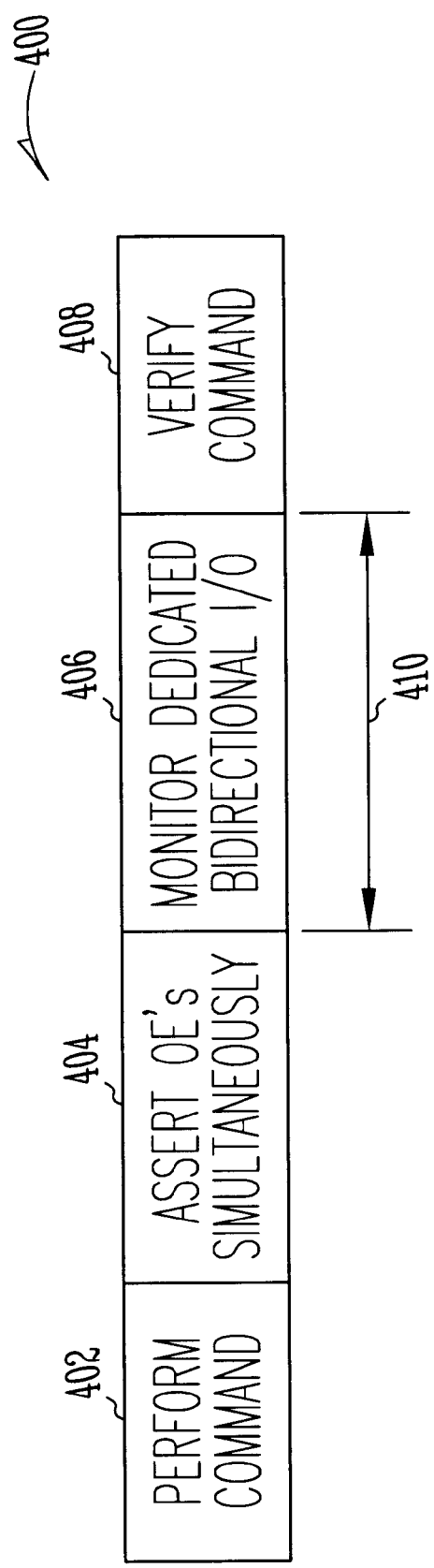
FIG. 4 shows operations performed by memory testing systems in accordance with the present invention.

FIG. 4 shows operations performed by memory testing systems in accordance with the present invention. Sequence 400 includes operations 402, 404, 406, and 408. Operation 402 occurs when a memory device tester issues a command to devices under test. For example, this can correspond to memory device tester 310 issuing a command such as a write command or an erase command to memory devices 302, 304, and 306 (FIG. 3).

In operation 404, the memory device tester asserts the output enable signals simultaneously. Referring now back to FIG. 3, when the output enable signals are asserted for each memory device, each memory device drives eight bits of data onto the data bus connected to its DQ[0 . . . 7] nodes. Each memory device drives seven bits onto a shared data bus, and also drives a single data bit onto a dedicated bidirectional tester channel. Memory device tester 310 can separately monitor the state of each bit coupled to a dedicated bidirectional tester channel. This is shown by operation 406 in FIG. 4.

Operation 406 corresponds to a memory device tester simultaneously monitoring the state of bidirectional tester channels dedicated to specific memory devices. This is in contrast to a serial polling operation that polls each memory device in sequence. In the embodiment of FIG. 4, rather than serial polling, a subset of data from each memory device is monitored in parallel. The time taken by operation 406 is shown at 410. The length of time 410 is controlled by the memory device tester, and is only as long as necessary to verify that each memory device is ready to continue. After completion of operation 406, operation 408 is utilized to verify that the memory devices properly executed the command issued in operation 402.

The method apparatus of the present invention is useful for any type of memory that can be tested in the manner described. A specific example using a Flash memory device is now presented. The example is for explanatory purposes only, and should not be construed as the only way to practice the invention. In a Flash memory device, a block of addresses is erased by issuing an "erase" command prior to performing a write command. To test the proper operation of the erase command, a memory device tester can issue the erase command and then verify, through a series of reads, that the correct addresses have been erased.

Figure 1B:
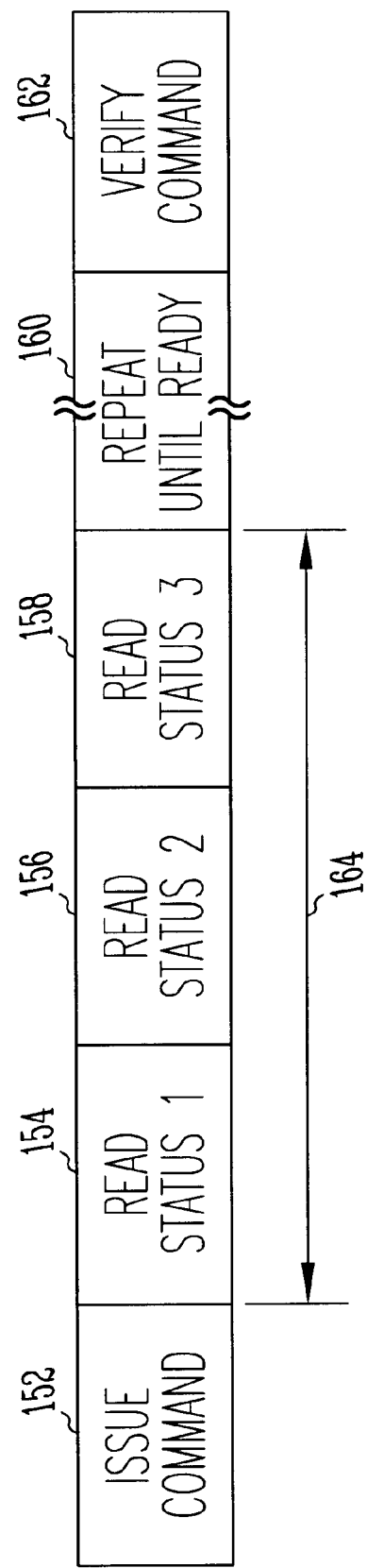
FIG. 1B shows operations performed by the memory test configuration of FIG. 1A.

Flash memory devices include a status register that incorporates a "ready" bit. The ready bit is asserted by the memory device when a command executed by the memory device has finished. For example, when a Flash memory device receives an erase command, the ready bit is cleared, and is then asserted when the erase operation is complete. Prior memory testing systems, such as that described with reference to FIG. 1, serially read the status register in each memory device under test until all ready bits are asserted. The method and apparatus of the present invention, in contrast, simultaneously monitors the ready bit from each memory device using dedicated bidirectional tester channels.

When the ready bit is asserted by all of the memory devices under test, the operation is verified by the memory tester. Continuing the current example of an erase command, the memory tester sequentially asserts the output enable signals of the different memory devices under test to verify that the appropriate memory locations have been cleared.

Figure 5:
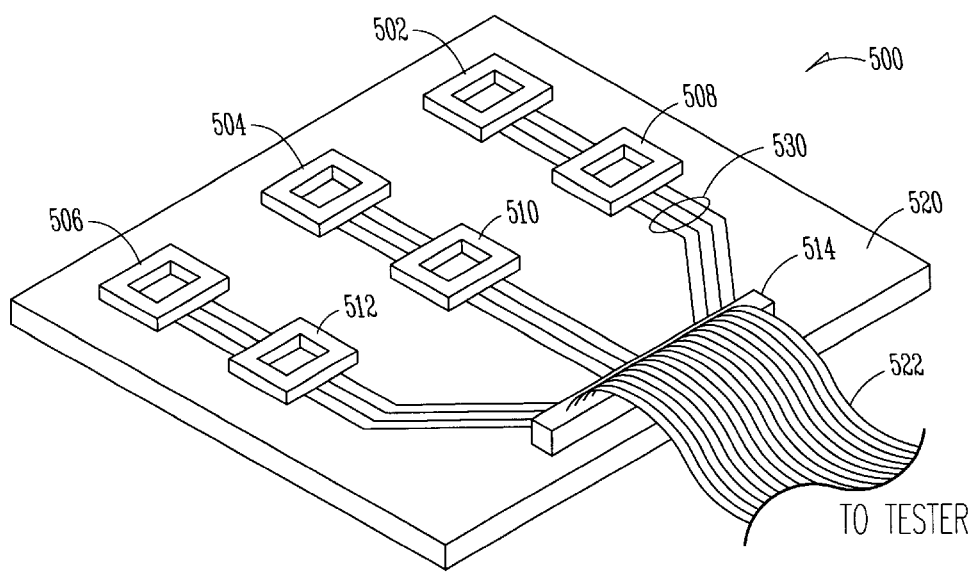
FIG. 5 is a perspective view of a test fixture in accordance with the present invention.

FIG. 5 is a perspective view of a test fixture in accordance with the present invention. Test fixture 500 includes printed circuit board 520, tester interface 514, and memory device receptacles 502, 504, 506, 508, 510, and 512. Six memory device receptacles are shown in FIG. 5, but this is not a limitation of the present invention. The memory device receptacles are electrically coupled to tester interface 514 by conductive paths 530. Conductive paths 530 implement the signal paths shown in FIG. 3 between the memory devices and the memory device tester. As such, some of conductive paths 530 are utilized for dedicated tester channels, and other conductive paths 530 are utilized for shared tester channels.

In the embodiment of FIG. 5, tester interface 514 includes a connector coupled to ribbon cable 522. In other embodiments, tester interface 514 is an interface other than a connector coupled to a ribbon cable. For example, in some embodiments tester interface 514 is a card edge connector, and test fixture 500 is a board that slides into a slot to be held in a chassis. The memory device receptacles shown in the embodiment of FIG. 5 include cavities to accept packaged parts. Any type of receptacle can be utilized to couple memory devices to printed circuit board 520. For example, the memory device receptacles can be zero insertion force (ZIF) sockets that hold pin grid array devices, or can be single in-line memory module (SIMM) connectors.

Figure 6:
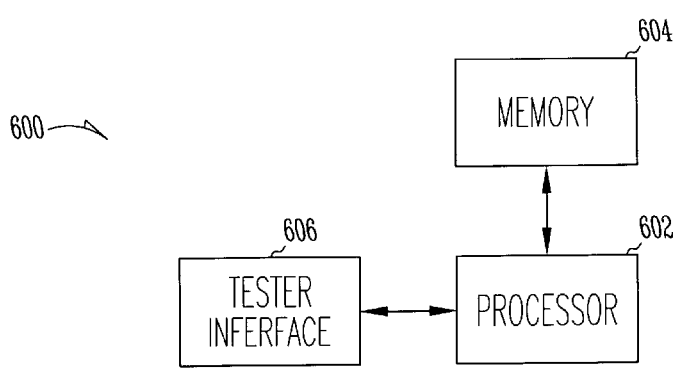
FIG. 6 shows a processing system in accordance with the present invention.

FIG. 6 shows a processing system in accordance with the present invention. System 600 includes processor 602, memory 604, and tester interface 606. System 600 can also include many other devices such as memory controllers, input/output devices, and others. These other devices are omitted from FIG. 6 to accentuate the items remaining in the figure. Processor 602 can be a microprocessor, digital signal processor, embedded processor, microcontroller, or the like. Tester interface 606 serves as an interface to a memory device tester such as memory device tester 310 (FIG. 3). System 600 can be included within a memory device tester, or can be a computer system separate from a memory device tester. For example, processor 602 can be a microprocessor in an industrial computer and tester interface 606 can be a general purpose interface bus (GPIB) interface to communicate with a stand-alone tester. Processor 602 is a processor capable of executing software that embodies any of the methods of the present invention, and memory 604 is a computer-readable medium capable of storing the software.

Conclusion

A memory testing system and method therefor have been described. A method of testing memory devices includes issuing a command to a Flash memory device, simultaneously monitoring at least one data bit of each Flash memory device for a ready indication, and then verifying the command was performed successfully in each Flash memory device. The command can be an erase command, a write command, or the like. The simultaneous monitoring can be performed by simultaneously asserting signals on output enable nodes of the memory devices, and monitoring bidirectional tester channels dedicated for this purpose. A test fixture includes memory device receptacles, a tester interface, and conductive paths to couple the tester interface to the memory device receptacles. The conductive paths include paths for dedicated bidirectional tester channels and shared bidirectional tester channels.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of factory testing a plurality of memory devices in parallel, comprising:
   connecting the plurality of memory devices to a factory test fixture;
   connecting the text fixture to a factory test machine;
   issuing an erase command aver shared channels to simultaneously erase a block of memory locations in each of the plurality of memory devices; and
   simultaneously monitoring at least one data bit on each of the plurality of memory devices over dedicated channels to determine when the plurality of memory devices are ready.

2. The method of claim 1 wherein simultaneously monitoring comprises monitoring one data bit using separate bidirectional tester channels coupled to each of the plurality of memory devices.

3. The method of claim 1 wherein simultaneously monitoring comprises simultaneously asserting output enable nodes of each of the plurality of memory devices using separate, dedicated, drive-only tester channels.

4. The method of claim 1 further comprising:
   when the plurality of memory devices are ready, sequentially verifying in each of the plurality of memory devices the successful operation of the erase command.

5. The method of claim 1 wherein the plurality of memory devices comprises a plurality of Flash memory devices, and issuing an erase command comprises issuing an erase command to the plurality of Flash memory devices.

6. A method of simultaneously testing a plurality of memory devices in parallel, comprising:
   connecting the plurality of memory devices to a factory memory testing machine over both shared and dedicated signal channels;
   issuing an erase command over a shared channel to simultaneously erase a block of memory locations in each of the plurality of memory devices;
   simultaneously monitoring at least one data bit on each of the plurality of memory devices over a dedicated channel to determine when the plurality of memory devices are ready; and
   when each of the plurality of memory devices are ready, verifying that the block of memory locations is erased in each of the plurality of memory devices.

7. The method of claim 6 wherein each of the at least one data bit on each of the plurality of memory devices is monitored using a dedicated bidirectional tester channel.

8. The method of claim 6 wherein each of the plurality of memory devices includes an output enable node, and each of the output enable nodes is driven by a corresponding one drive-only tester channel.

9. The method of claim 6 wherein a plurality of data bits of each of the plurality of memory devices are coupled to shared bidirectional tester channels.

10. The method of claim 6 wherein the plurality of memory devices comprise Flash memory devices.

11. A method of factory testing memory devices in parallel comprising:
   connecting the memory devices to a factory memory testing machine over both shared and dedicated signal channels;
   simultaneously writing a data value to a common location within the memory devices over shared signal channels; and
   simultaneously monitoring one data bit from each of the memory devices using a separate dedicated bidirectional tester channel for each.

12. The method of claim 11 wherein all other data bits from each of the memory devices are coupled to shared bidirectional tester channels such that each of the memory devices has one data bit coupled to a dedicated bidirectional tester channel, and a plurality of data bits coupled to shared bidirectional tester channels.

13. The method of claim 11 wherein the memory devices comprise Flash memory devices.

14. The method of claim 11 wherein each memory device includes an output enable node, and monitoring comprises simultaneously asserting signals on the output enable nodes.

15. The method of claim 14 further comprising:
sequentially asserting signals on the output enable nodes to sequentially verify the data value at the common location in each memory device.

16. A method of production testing memory devices in parallel, comprising:
connecting the memory devices to a memory test device;
simultaneously writing a data value from the memory test device to a common location within the memory devices using a data bus, the data bus having at least one shared data line connected in parallel to the memory devices and having at least one dedicated data line dedicated to each memory device; and
simultaneously monitoring the at least one dedicated data line from each of the memory devices using a separate bidirectional tester channel for each dedicated data line.

17. The method of claim 16 wherein writing occurs in parallel using a drive-only tester channel coupled in parallel to write enable nodes of the memory devices.

18. The method of claim 16 wherein the memory devices include address lines coupled in parallel to drive-only tester channels, and writing a data value to a common location comprises asserting the common location address on the drive-only tester channels.

19. The method of claim 16 wherein the method is performed by an automated tester having drive-only tester channels and bidirectional tester channels.

20. A method of parallel testing memory devices comprising:
connecting the memory devices to a memory test device;
writing a data value to a common location within the memory devices using a data bus connected to the memory test device, the data bus having at least one shared data line connected in parallel to the memory devices and having at least one dedicated data line dedicated to each memory device;
simultaneously monitoring the at least one dedicated data line from each of the memory devices using a separate bidirectional tester channel connected to the memory test device for each dedicated data line; and
verifying the data value was written to the common location within the memory devices.

21. The method of claim 20 wherein each memory device includes an output enable node coupled to a separate dedicated drive-only tester channel, and verifying comprises sequentially asserting signals on the output enable nodes.

22. The method of claim 20 wherein monitoring comprises monitoring the at least one dedicated data line for a ready indication, and verifying comprises waiting for the ready indication and reading the data value.

23. The method of claim 20 wherein the memory devices comprise Flash memory devices.

24. The method of claim 20 wherein the method is performed by an automated memory tester using a test fixture coupled to the memory devices.

25. A method of simultaneously testing a plurality of Flash memory devices in parallel, comprising:
connecting the plurality of Flash memory devices to a memory test device;
issuing a command to the plurality of Flash memory devices simultaneously over shared test channels from the memory test device;
simultaneously enabling a plurality of data outputs on each of the Flash memory devices by separately asserting output enable signals over dedicated test channels from the memory test device; and
simultaneously monitoring at least one of the plurality of data outputs on each of the plurality of memory devices.

26. The method of claim 25 wherein issuing a command comprises issuing an erase command.

27. The method of claim 25 wherein issuing a command comprises issuing a write command.

28. The method of claim 25 wherein monitoring at least one of the plurality of outputs comprises monitoring one bidirectional tester channel for each of the plurality of Flash memory devices for a ready indication.

29. The method of claim 28 further comprising:
when the ready indication is received from each of the plurality of Flash memory devices, sequentially verifying proper completion of the command for each of the plurality of Flash memory devices.

30. A method of simultaneously testing a plurality of Flash memory devices in parallel, comprising:
connecting the plurality of Flash memory devices to a memory test device;
issuing an erase command to the plurality of Flash memory devices simultaneously over shared test channels from the memory test device;
simultaneously enabling a plurality of data outputs on each of the Flash memory devices by separately asserting output enable signals;
simultaneously monitoring at least one of the plurality of data outputs on each of the plurality of memory devices over a dedicated test channel for a ready indication; and
enabling the plurality of data outputs on each of the Flash memory devices in sequence to verify the erase command.

31. The method of claim 30 wherein the at least one of the plurality of data outputs on each of the Flash memory devices monitored for a ready indication is coupled to a dedicated bidirectional tester channel, and monitoring comprises monitoring the dedicated bidirectional tester channel.

32. A method of simultaneously testing a plurality of Flash memory devices in parallel, comprising:
connecting the plurality of Flash memory devices to a memory test device;
issuing an erase command to the plurality of Flash memory devices simultaneously over shared test signal lines from the memory test device to perform an erase operation;
simultaneously enabling a plurality of data outputs on each of the Flash memory devices over dedicated test lines from the memory tester by separately asserting an output enable signal for each of the Flash memory devices;

simultaneously monitoring at least one of the plurality of data outputs on each of the plurality of Flash memory devices over dedicated signal test channels for an indication that the erase operation is complete; and enabling the plurality of data outputs on each of the Flash memory devices in sequence to verify the erase command.

33. The method of claim 32 wherein enabling the plurality of data outputs on each of the Flash memory devices in sequence to verify the erase command comprises:

sequentially asserting the output enable signal for each of the Flash memory devices.

34. A test fixture for testing memory devices comprising:

a first memory device receptacle to receive a first memory device;

a second memory device receptacle to receive a second memory device;

a memory tester interface; and conductive paths between the tester interface, the first memory device receptacle, and the second memory device receptacle such that at least one data node on each memory device receptacle is dedicated to a separate bidirectional tester channel on the memory tester interface, and at least one other data node on each memory device receptacle is connected in parallel to share a bidirectional tester channel on the memory tester interface to allow simultaneous parallel testing of the memory devices.

35. The test fixture of claim 34 wherein one data node on each memory device receptacle is dedicated to a separate bidirectional tester channel, and all other data nodes on the memory receptacles are connected in parallel to form a shared bus.

36. The test fixture of claim 34 wherein the conductive paths comprise signal traces coupling dedicated drive-only tester channels to output enable nodes of the memory device receptacles.

37. The test fixture of claim 34 wherein the conductive paths includes one shared signal trace coupled between the tester interface and write enable nodes of each memory device receptacle.

38. A memory device test fixture comprising:

a plurality of memory device receptacles;

at least one tester interface to couple bidirectional tester channels to the plurality of memory device receptacles; and a plurality of signal traces coupling the plurality of memory device receptacles to the at least one tester interface, wherein at least one bidirectional tester channel is shared among more than one of the plurality of memory device receptacles, and at least one other bidirectional tester channel is dedicated to each of the plurality of memory device receptacles to facilitate simultaneous communication with the memory device receptacles over dedicated and shared signal lines.

39. A memory device test fixture comprising:

a plurality of memory device receptacles;

at least one tester interface to couple bidirectional tester channels and drive-only tester channels to the plurality of memory device receptacles; and a plurality of signal traces coupling the plurality of memory device receptacles to the at least one tester interface, wherein at least one bidirectional tester channel and at least one drive-only tester channel are shared among more than one of the plurality of memory device receptacles, and at least one other bidirectional tester channel and at least one other drive-only tester channel are dedicated to each of the plurality of memory device receptacles to facilitate simultaneous communication with the memory device receptacles over dedicated and shared signal lines.

40. The memory device test fixture of claim 39 wherein the plurality of memory device receptacles are configured to accept Flash memory devices, and each of the plurality of memory device receptacles has a single bidirectional tester channel dedicated thereto.

41. The memory device test fixture of claim 39 wherein the plurality of memory device receptacles are configured to accept Flash memory devices having a data bus, and the at least one other bidirectional tester channel is coupled to one bit of the data bus, the one bit corresponding to a location of an indicator bit in the Flash memory devices.

42. The memory device test fixture of claim 39 wherein the fixture comprises a printed circuit board, and the signal traces comprise signal traces on the printed circuit board.

43. A parallel memory testing system comprising:

a memory tester having bidirectional tester channels and drive-only tester channels;

a test fixture coupled to the tester, the test fixture being configured to hold a plurality of memory device receptacles; and a plurality of signal paths from the tester to the test fixture, the plurality of signal paths coupled to the bidirectional tester channels such that some bidirectional tester channels are coupled in parallel to more than one of the plurality of memory device receptacles, and other bidirectional tester channels are each dedicated to a single node of one memory device receptacle receptacles to facilitate simultaneous communication with the memory device receptacles over dedicated and shared signal lines.

44. The memory testing system of claim 43 wherein the test fixture comprises a printed circuit board, and the signal paths comprise traces on the printed circuit board.

45. The memory testing system of claim 43 wherein the bidirectional tester channels that are each dedicated to a single node are dedicated to a node that presents a ready indication when testing.

* * * * *

UNITED STATES PATENT AND TRADEMARK OFFICE
CERTIFICATE OF CORRECTION

PATENT NO. : 6,901,541 B2
DATED : May 31, 2005
INVENTOR(S) : Antosh et al.

It is certified that error appears in the above-identified patent and that said Letters Patent is hereby corrected as shown below:

Column 6,
Line 7, delete "aver" and insert -- over --, therefor.

Signed and Sealed this

Twenty-ninth Day of November, 2005

JON W. DUDAS
*Director of the United States Patent and Trademark Office*